United States Patent
Plihal

(10) Patent No.: US 9,891,538 B2
(45) Date of Patent: Feb. 13, 2018

(54) ADAPTIVE SAMPLING FOR PROCESS WINDOW DETERMINATION

(71) Applicant: KLA-Tencor Corporation, Milpitas, CA (US)

(72) Inventor: Martin Plihal, Pleasanton, CA (US)

(73) Assignee: KLA-Tencor Corp., Milpitas, CA (US)

( * ) Notice: Subject to any disclaimer, the term of this patent is extended or adjusted under 35 U.S.C. 154(b) by 7 days.

(21) Appl. No.: 15/067,118

(22) Filed: Mar. 10, 2016

(65) Prior Publication Data

US 2016/0274036 A1    Sep. 22, 2016

Related U.S. Application Data

(60) Provisional application No. 62/133,823, filed on Mar. 16, 2015.

(51) Int. Cl.

| G01N 21/95 | (2006.01) |
| H01L 21/67 | (2006.01) |
| G03F 7/20  | (2006.01) |
| H01L 21/66 | (2006.01) |

(52) U.S. Cl.
CPC .......... *G03F 7/7065* (2013.01); *H01L 22/12* (2013.01); *H01L 22/20* (2013.01)

(58) Field of Classification Search
CPC ........ G03F 7/7065; H01L 22/20; H01L 22/12
See application file for complete search history.

(56) References Cited

U.S. PATENT DOCUMENTS

| 6,902,855 B2 | 6/2005  | Peterson et al. |
| 7,418,124 B2 | 8/2008  | Peterson et al. |
| 7,769,225 B2 | 8/2010  | Kekare et al. |
| 8,041,106 B2 | 10/2011 | Pak et al. |
| 8,213,704 B2 | 7/2012  | Peterson et al. |
| 8,664,594 B1 | 4/2014  | Jiang et al. |
| 8,692,204 B2 | 4/2014  | Kojima et al. |
| 8,698,093 B1 | 4/2014  | Gubbens et al. |
| 8,716,662 B1 | 5/2014  | MacDonald et al. |
| 2007/0133860 A1* | 6/2007 | Lin .......................... G06T 7/001 382/149 |

(Continued)

OTHER PUBLICATIONS

International Search Report for PCT/US2016/022499 dated Jun. 24, 2016.
Written Opinion for PCT/US2016/022499 dated Jun. 24, 2016.

*Primary Examiner* — John Breene
*Assistant Examiner* — Mohammad Islam
(74) *Attorney, Agent, or Firm* — Ann Marie Mewherter

(57) ABSTRACT

Methods and systems for determining a process window for a process performed on a specimen are provided. In general, the embodiments preferentially sample locations in an instance of at least a portion of a device formed on a specimen at a value of a parameter of a process performed on the specimen that is closest to an edge of a determined process window for the process. If defects are detected at the sampled locations, then the sampling may be performed again but for a different instance of the device formed at a value of the parameter that is closer to nominal than the previously used value. When no defects are detected at the sampled locations, then the sampling may be ended, and the determined process window may be modified based on the value of the parameter corresponding to the instance of the device in which no defects were detected.

19 Claims, 3 Drawing Sheets

(56) References Cited

U.S. PATENT DOCUMENTS

| | | | |
|---|---|---|---|
| 2007/0286473 A1* | 12/2007 | Leslie | G01N 21/9501 382/146 |
| 2007/0288219 A1* | 12/2007 | Zafar | G03F 1/84 703/14 |
| 2008/0072207 A1 | 3/2008 | Verma et al. | |
| 2008/0163140 A1* | 7/2008 | Fouquet | G03F 1/84 700/110 |
| 2008/0250384 A1 | 10/2008 | Duffy et al. | |
| 2010/0142800 A1* | 6/2010 | Tung-Sing Pak | G01N 21/956 382/149 |
| 2013/0279792 A1 | 10/2013 | Hess et al. | |
| 2015/0356233 A1* | 12/2015 | Fouquet | G06F 17/5081 438/5 |
| 2017/0038692 A1* | 2/2017 | Hsu | G03F 1/36 |

\* cited by examiner

ADAPTIVE SAMPLING FOR PROCESS WINDOW DETERMINATION

BACKGROUND OF THE INVENTION

1. Field of the Invention

This invention generally relates to methods and systems for determining a process window for a process performed on a specimen with adaptive sampling.

2. Description of the Related Art

The following description and examples are not admitted to be prior art by virtue of their inclusion in this section.

Inspection processes are used at various steps during a semiconductor manufacturing process to detect defects on wafers to promote higher yield in the manufacturing process and thus higher profits. Inspection has always been an important part of fabricating semiconductor devices. However, as the dimensions of semiconductor devices decrease, inspection becomes even more important to the successful manufacture of acceptable semiconductor devices because smaller defects can cause the devices to fail.

Process window qualification (PWQ) is a type of inspection performed on a specimen fabricated in a particular way that is essential to check if a specific chip design can be manufactured (free of critical hot spots) and to decide about the optimal parameters for a lithography process (e.g., focus/exposure). Usually, a focus-exposure modulated specimen is printed to simulate different process window conditions. The specimen is then inspected using a relatively sensitive bright field (BF) inspection tool. The detected defects are divided into bins by a design-based algorithm that classifies the defects by type of printing error (a unique design structure is associated with each bin). To determine how a printing error is affecting the chip yield at different process modulations, a defect sampling strategy followed by scanning electron microscope (SEM) review is performed. For example, a few representative defects from each bin can be visited at different die modulations. This time consuming procedure checks how a structure responds to changes in lithography parameters (focus/exposure) and finally the process window limits are determined. To increase sensitivity, a second iteration is sometimes performed. In that case, the previously identified printing errors can be used as care areas in the wafer inspection. The complete procedure may then be repeated.

The current best known method (BKM) for process window determination may also leverage existing software and algorithm capabilities in design-based care area technology for analyzing PWQ wafers. This approach has been designed for improving the quality of the PWQ results such as hot spot discovery and process window qualification. Some PWQ inspections introduce a second inspection pass into the flow. The first scan is designed for hot spot discovery, and the second scan is designed for determining the process window by monitoring the hot spots discovered in the first scan.

There are, however, several disadvantages to currently used methods for PWQ. For example, one disadvantage of the currently used methods is related to the sampling strategy for SEM review. The assumption on which currently used sampling is based is that a systematic printing error is accurately represented by a few selected defects/locations observed using SEM review (representative sampling). If the assumption is invalid, hot spots can be missed or process window can be incorrectly reported. In addition, the benefits of the two pass PWQ inspection described above are achieved by introducing design-based care area capabilities, two pass PWQ inspection, increased sample size, and combining several available sampling strategies into a more efficient overall system. However, no attempt has been made so far to develop new sampling strategies that are aligned with the two distinct goals of hot spot discovery and process window identification. In particular, the sampling method currently employed in the second pass PWQ inspection may be composed of a variety of sampling schemes such as PWQ sampling, design-based binning (DBB) sampling, diversity sampling, and care area group code (CAGCode) sampling, all of which have some desirable features for process window determination, but none of them is actually very well suited for it. All of the sampling methods, when used in combination, actually can waste a lot of the sample size due to overlapping criteria and goals. There is simply no sampling method specifically targeted for process window determination.

Accordingly, it would be advantageous to develop systems and/or methods for determining a process window for a process performed on a specimen with adaptive sampling that do not have one or more of the disadvantages described above.

SUMMARY OF THE INVENTION

The following description of various embodiments is not to be construed in any way as limiting the subject matter of the appended claims.

One embodiment relates to a system configured to determine a process window for a process performed on a specimen. The system includes an output acquisition subsystem that includes at least an energy source and a detector. The energy source is configured to generate energy that is directed to a specimen. The detector is configured to detect energy from the specimen and to generate output responsive to the detected energy.

The system also includes one or more computer subsystems configured for acquiring results of an inspection of the specimen. The specimen includes multiple instances of at least a portion of a device formed thereon with different values of a parameter of a process performed on the specimen. The results of the inspection include information for defects detected in the multiple instances during the inspection, information for hot spots within the at least the portion of the device detected during the inspection, and information for a process window of the process determined by the inspection.

The one or more computer subsystems are also configured for selecting, based on the results of the inspection, a portion of the locations within a first of the multiple instances formed on the specimen with a first of the different values that is closest to a value of the parameter at an edge of the process window. The computer subsystem(s) are further configured for acquiring the output of the output acquisition subsystem for at least one of the locations in the portion. In addition, the computer subsystem(s) are configured for determining if defects are present at the least one of the locations based on the acquired output.

When one or more of the defects are determined to be present at the at least one of the locations, the computer subsystem(s) are configured for repeating the selecting, acquiring the output, and determining if the defects are present for another of the multiple instances formed on the specimen with another of the different values that is closer to nominal than the first of the different values. When the defects are determined to be not present at the locations in the selected portion, the computer subsystem(s) are configured for determining a revised process window based on which of the different values corresponds to the multiple instance in which the defects were determined to be not present. The system may be further configured as described herein.

Another embodiment relates to a computer-implemented method for determining a process window for a process performed on a specimen. The method includes steps for each of the functions of the one or more computer subsystems described above. The steps of the method are performed by one or more computer subsystems. The method may be performed as described further herein. In addition, the method may include any other step(s) of any other method(s) described herein. Furthermore, the method may be performed by any of the systems described herein.

An additional embodiment relates to a non-transitory computer-readable medium storing program instructions executed on a computer system for performing a computer-implemented method for determining a process window for a process performed on a specimen. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Other objects and advantages of the invention will become apparent upon reading the following detailed description and upon reference to the accompanying drawings in which.

Figure 1:
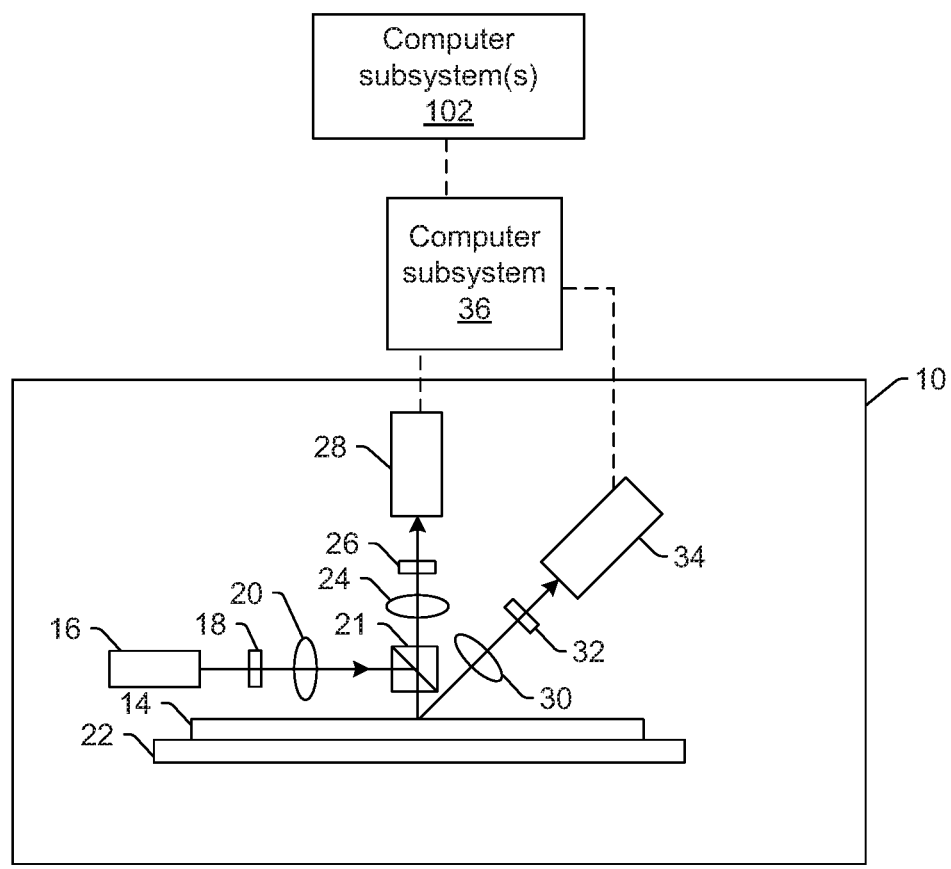
FIGS. 1 and 2 are schematic diagrams illustrating side views of embodiments of a system configured as described herein.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

One embodiment relates to a system configured to determine a process window for a process performed on a specimen. In general, the embodiments described herein provide adaptive approaches to process window determination on process window qualification (PWQ) wafers and other specimens. For example, the embodiments described herein provide a new sampling approach, which may be performed after a second pass PWQ inspection, with the specific goal of identifying better (e.g., tighter) process windows.

In one embodiment, the specimen includes a wafer. In another embodiment, the specimen includes a reticle. The wafer and the reticle may include any wafer and reticle known in the art.

One embodiment of such a system is shown in FIG. 1. The system includes an output acquisition subsystem that includes at least an energy source and a detector. The energy source is configured to generate energy that is directed to a specimen. The detector is configured to detect energy from the specimen and to generate output responsive to the detected energy.

In one embodiment, the energy directed to the specimen includes light, and the energy detected from the specimen includes light. For example, in the embodiment of the system shown in FIG. 1, output acquisition subsystem 10 includes an illumination subsystem configured to direct light to specimen 14. The illumination subsystem includes at least one light source. For example, as shown in FIG. 1, the illumination subsystem includes light source 16. In one embodiment, the illumination subsystem is configured to direct the light to the specimen at one or more angles of incidence, which may include one or more oblique angles and/or one or more normal angles. For example, as shown in FIG. 1, light from light source 16 is directed through optical element 18 and then lens 20 to beam splitter 21, which directs the light to specimen 14 at a normal angle of incidence. The angle of incidence may include any suitable angle of incidence, which may vary depending on, for instance, characteristics of the specimen and the defects to be detected on the specimen.

The illumination subsystem may be configured to direct the light to the specimen at different angles of incidence at different times. For example, the output acquisition subsystem may be configured to alter one or more characteristics of one or more elements of the illumination subsystem such that the light can be directed to the specimen at an angle of incidence that is different than that shown in FIG. 1. In one such example, the output acquisition subsystem may be configured to move light source 16, optical element 18, and lens 20 such that the light is directed to the specimen at a different angle of incidence.

In some instances, the output acquisition subsystem may be configured to direct light to the specimen at more than one angle of incidence at the same time. For example, the illumination subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen at different angles of incidence may be different such that light resulting from illumination of the specimen at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the specimen. Multiple illumination channels may be configured to direct light to the specimen at the same time or at different times (e.g., when different illumination channels are used to sequentially illuminate the specimen). In another instance, the same illumination channel may be configured to direct light to the specimen with different characteristics at different times. For example, in some instances, optical element 18 may be configured as a spectral filter and the properties of the spectral filter can be changed in a variety of different ways (e.g., by swapping out the spectral filter) such that different wavelengths of light can be directed to the specimen at different times. The illumination subsystem may have any other suitable configuration known in the art for directing the light having different or the same characteristics to the specimen at different or the same angles of incidence sequentially or simultaneously.

In one embodiment, light source 16 may include a broadband plasma (BBP) light source. In this manner, the light generated by the light source and directed to the specimen may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused to beam splitter 21 by lens 20. Although lens 20 is shown in FIG. 1 as a single refractive optical element, it is to be understood that, in practice, lens 20 may include a number of refractive and/or reflective optical elements that in combination focus the light from the optical element to the specimen. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the system may be configured to alter one or more of the elements of the illumination subsystem based on the type of illumination to be used for output acquisition.

The output acquisition subsystem may also include a scanning subsystem configured to cause the light to be scanned over the specimen. For example, the output acquisition subsystem may include stage 22 on which specimen 14 is disposed during output acquisition. The scanning subsystem may include any suitable mechanical and/or robotic assembly (that includes stage 22) that can be configured to move the specimen such that the light can be scanned over the specimen. In addition, or alternatively, the output acquisition subsystem may be configured such that one or more optical elements of the output acquisition subsystem perform some scanning of the light over the specimen. The light may be scanned over the specimen in any suitable fashion.

The output acquisition subsystem further includes one or more detection channels. At least one of the one or more detection channels includes a detector configured to detect light from the specimen due to illumination of the specimen by the output acquisition subsystem and to generate output responsive to the detected light. For example, the output acquisition subsystem shown in FIG. 1 includes two detection channels, one formed by collector 24, element 26, and detector 28 and another formed by collector 30, element 32, and detector 34. As shown in FIG. 1, the two detection channels are configured to collect and detect light at different angles of collection. In some instances, one detection channel is configured to detect specularly reflected light, and the other detection channel is configured to detect light that is not specularly reflected (e.g., scattered, diffracted, etc.) from the specimen. However, two or more of the detection channels may be configured to detect the same type of light from the specimen (e.g., specularly reflected light). Although FIG. 1 shows an embodiment of the output acquisition subsystem that includes two detection channels, the output acquisition subsystem may include a different number of detection channels (e.g., only one detection channel or two or more detection channels). Although each of the collectors are shown in FIG. 1 as single refractive optical elements, it is to be understood that each of the collectors may include one or more refractive optical element(s) and/or one or more reflective optical element(s).

The one or more detection channels may include any suitable detectors known in the art. For example, the detectors may include photo-multiplier tubes (PMTs), charge coupled devices (CCDs), and time delay integration (TDI) cameras. The detectors may also include any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the output acquisition system may be signals or data, but not image signals or image data. In such instances, a computer subsystem such as computer subsystem 36 of the system may be configured to generate images of the specimen from the non-imaging output of the detectors. However, in other instances, the detectors may be configured as imaging detectors that are configured to generate imaging signals or image data. Therefore, the system may be configured to generate the output described herein in a number of ways.

It is noted that FIG. 1 is provided herein to generally illustrate a configuration of an output acquisition subsystem that may be included in the system embodiments described herein. Obviously, the output acquisition subsystem configuration described herein may be altered to optimize the performance of the system as is normally performed when designing a commercial inspection or defect review system. In addition, the systems described herein may be implemented using an existing output acquisition system (e.g., by adding functionality described herein to an existing output acquisition system) such as optical inspection and/or defect review tools such as the 28xx and 29xx series of tools that are commercially available from KLA-Tencor, Milpitas, Calif., and other tools that are commercially available from other sources. For some such systems, the methods described herein may be provided as optional functionality of the system (e.g., in addition to other functionality of the system). Alternatively, the system described herein may be designed "from scratch" to provide a completely new system.

Computer subsystem 36 of the system may be coupled to the detectors of the output acquisition subsystem in any suitable manner (e.g., via one or more transmission media, which may include "wired" and/or "wireless" transmission media) such that the computer subsystem can receive the output generated by the detectors during scanning of the specimen. Computer subsystem 36 may be configured to perform a number of functions using the output of the detectors as described herein and any other functions described further herein. This computer subsystem may be further configured as described herein.

This computer subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems as described further herein. For example, computer subsystem 36 may be coupled to computer subsystem(s) 102 (as shown by the dashed line in FIG. 1) by any suitable transmission media, which may include any suitable wired and/or wireless transmission media known in the art. Two or more of such computer subsystems may also be effectively coupled by a shared computer-readable storage medium (not shown).

Although the output acquisition subsystem is described above as being an optical or light-based output acquisition subsystem, the output acquisition subsystem may be an electron beam-based output acquisition subsystem. For example, in one embodiment, the energy directed to the specimen includes electrons, and the energy detected from the specimen includes electrons. In this manner, the energy source may be an electron beam source. In one such embodiment shown in FIG. 2, the output acquisition subsystem includes electron column 122, which is coupled to computer subsystem 124.

Figure 2:
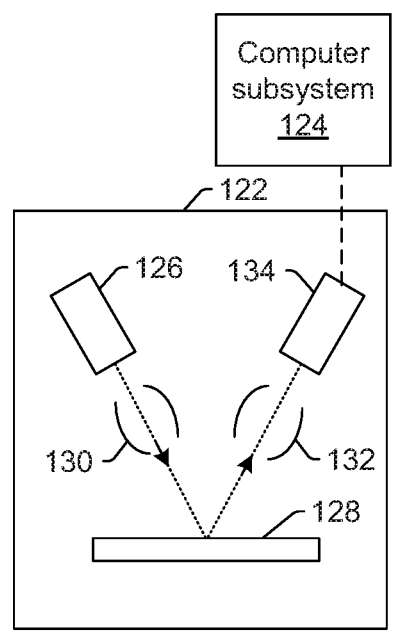

As also shown in FIG. 2, the electron column includes electron beam source 126 configured to generate electrons that are focused to specimen 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the specimen (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 2 as being configured such that the electrons are directed to the specimen at an oblique angle of incidence and are scattered from the specimen at another oblique angle, it is to be understood that the electron beam may be directed to and scattered from the specimen at any suitable angles. In addition, the electron beam-based subsystem may be configured to use multiple modes to generate images of the specimen (e.g., with different illumination angles, collection angles, etc.). The multiple modes of the electron beam-based subsystem may be different in any image generation parameters of the subsystem.

Computer subsystem 124 may be coupled to detector 134 as described above. The detector may detect electrons returned from the surface of the specimen thereby forming electron beam images of the specimen. The electron beam images may include any suitable electron beam images. Computer subsystem 124 may be configured to perform any of the functions described herein using the output of the detector and/or the electron beam images. Computer subsystem 124 may be configured to perform any additional step(s) described herein. A system that includes the output acquisition subsystem shown in FIG. 2 may be further configured as described herein.

It is noted that FIG. 2 is provided herein to generally illustrate a configuration of an electron beam-based output acquisition subsystem that may be included in the embodiments described herein. As with the optical output acquisition subsystem described above, the electron beam-based output acquisition subsystem configuration described herein may be altered to optimize the performance of the output acquisition subsystem as is normally performed when designing a commercial inspection or defect review system. In addition, the systems described herein may be implemented using an existing inspection or defect review system (e.g., by adding functionality described herein to an existing inspection or defect review system) such as the eDR-xxxx series of tools that are commercially available from KLA-Tencor. For some such systems, the methods described herein may be provided as optional functionality of the system (e.g., in addition to other functionality of the system). Alternatively, the system described herein may be designed "from scratch" to provide a completely new system.

Although the output acquisition subsystem is described above as being a light- or electron beam-based output acquisition subsystem, the output acquisition subsystem may be an ion beam-based output acquisition subsystem. Such an output acquisition subsystem may be configured as shown in FIG. 2 except that the electron beam source may be replaced with any suitable ion beam source known in the art. In addition, the output acquisition subsystem may be any other suitable ion beam-based subsystem such as those included in commercially available focused ion beam (FIB)

systems, helium ion microscopy (HIM) systems, and secondary ion mass spectroscopy (SIMS) systems.

In some instances, inspection of the specimen may be performed by an optical inspection system. For example, an optical output acquisition subsystem such as that described above may be configured for inspection rather than defect review. In such instances, post-inspection output acquisition may be performed by an optical output acquisition subsystem having one or more different parameters than the optical output acquisition subsystem used for inspection (e.g., such that the optical output acquisition subsystem used for post-inspection has a higher resolution than the output acquisition subsystem used for inspection). Alternatively, post-inspection output acquisition may be performed by an electron beam output acquisition subsystem. However, inspection and post-inspection processes may be performed with electron beam based output acquisition subsystems, having different configurations that make them more suitable for the processes in which they will be used. In this manner, in some embodiments, the system includes one of the output acquisition subsystems described herein, and inspection of the specimen is performed with another output acquisition subsystem having a configuration different than the output acquisition subsystem. For example, the system embodiments described herein may be configured as defect review tools that are different from inspection tools. In one particular example, the system embodiments described herein may be configured as scanning electron microscope (SEM) review stations that are different from optical inspection tools used to perform the inspection of the specimen.

The one or more computer subsystems described further herein may be coupled to the output acquisition subsystem that performs inspection of the specimen. Alternatively, other one or more computer subsystems may be coupled to the output acquisition subsystem that performs inspection of the specimen. Such computer subsystem(s) may be configured as described further herein. In any case, one or more computer subsystems coupled to the output acquisition subsystem used for inspection are configured for detecting defects on the specimen based on the output generated by one or more detectors of the output acquisition subsystem. The defects may be detected on the specimen in any suitable manner (e.g., by applying a threshold to the output and identifying output having one or more values above the threshold as a defect and not identifying output having one or more values below the threshold as a defect). The defects detected on the specimen may include any defects known in the art.

In this manner, the computer subsystem(s) included in the systems described herein do not necessarily generate the results of inspection. For example, the computer subsystem(s) may be configured to acquire results of an inspection of the specimen. The results of the inspection of the specimen may be acquired by the computer subsystem(s) described herein directly from the system that performs the inspection (e.g., from a computer subsystem of the inspection system) or from a storage medium in which the inspection results have been stored such as a fab database.

Figure 3:
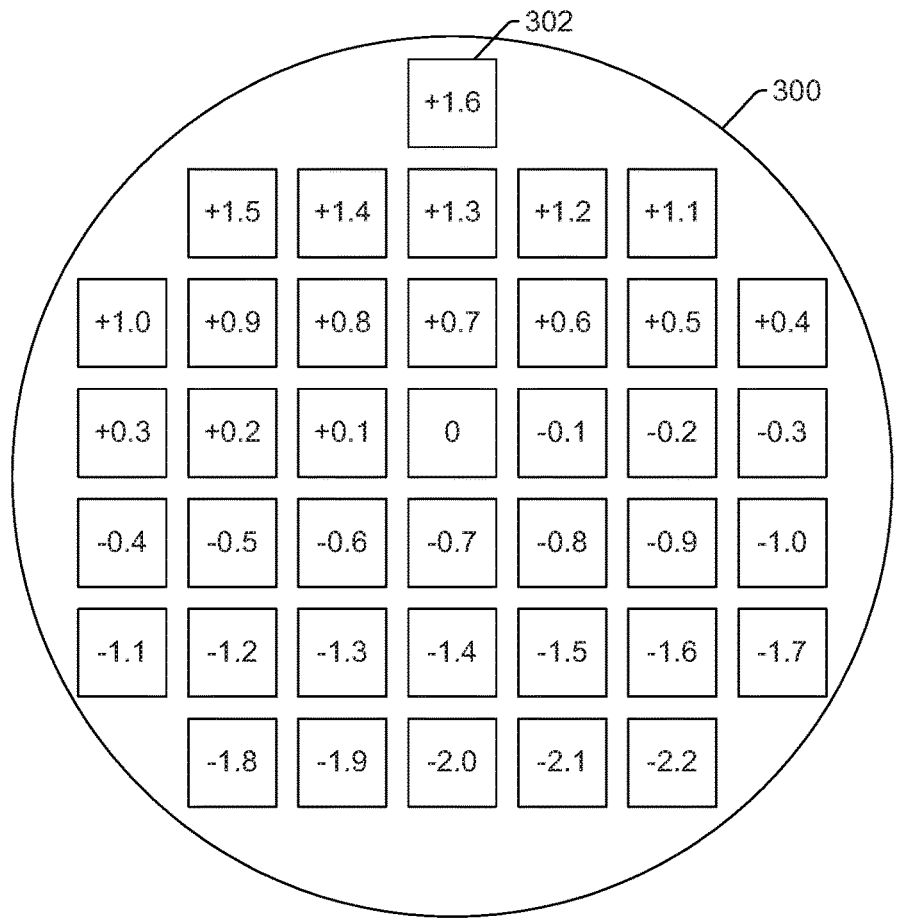
FIG. 3 is a schematic diagram illustrating a plan view of one embodiment of multiple instances of at least a portion of a device formed on a specimen with different values of a parameter of a process performed on the specimen.

The specimen includes multiple instances of at least a portion of a device formed thereon with different values of a parameter of a process performed on the specimen. For example, as shown in FIG. 3, specimen 300 in this embodiment is shown as a wafer. In addition, although FIG. 3 will show the multiple instances as different dies, the multiple instances may be other device portions such as different fields and the like. As shown in FIG. 3, a number of dies 302 are formed on the wafer. In this example, different values for only one parameter of a process are shown. In particular, the different values shown in FIG. 3 are different values for focus of a lithography process. As further shown in FIG. 3, the values for focus may include both negative and positive values as well as 0 focus. In addition, although certain values for focus are shown in FIG. 3, the values for the focus may include any suitable values for any given combination of lithography process and wafer. The 0 focus value may be the nominal value for focus for a lithography process. However, a different focus value may be the nominal value for focus for a lithography process. The "nominal" value in general can be defined as the center of a process window and/or the best known parameter value for a given fabrication process and specimen.

As further shown in FIG. 3, only one die is formed on the wafer for each different value of the focus parameter. In this manner, regardless of which die is formed at the nominal value of focus, no more than one die is formed on the wafer for the nominal value of focus. However, the specimen may have more than one die formed thereon at the nominal value for the parameter (e.g., depending on how the inspection will be performed, one or more instances formed at the nominal value may be formed in one or more locations to aid in scanning and comparing of the multiple instances).

Although the embodiment shown in FIG. 3 shows a wafer having dies formed thereon with different values of only one parameter of a process, the specimen may in some instances have dies formed thereon with different values of more than one parameter of the process. For example, in some instances, the values of one parameter may be different across the rows on the specimen while the values of another parameter may be different across the columns on the specimen. In one such example, the values for dose of a lithography process may vary from die-to-die in the columns on the specimen while the values for focus of the lithography process may vary from die-to-die in the rows on the specimen. In general, however, the dies having different values of more than one parameter may have any suitable layout on the specimen known in the art.

In general, the embodiments described herein are not specific to any manner in which the multiple instances are formed on the specimen with different values of one or more parameters of the process. For example, multiple instances of a portion of a device may also be formed on a specimen with different values of a process parameter as described in U.S. Pat. No. 6,902,855 to Peterson et al. issued on Jun. 7, 2005, U.S. Pat. No. 7,418,124 to Peterson et al. issued on Aug. 26, 2008, U.S. Pat. No. 7,769,225 to Kekare et al. issued on Aug. 3, 2010, U.S. Pat. No. 8,041,106 to Pak et al. issued on Oct. 18, 2011, and U.S. Pat. No. 8,213,704 to Peterson et al. issued on Jul. 3, 2012, which are incorporated by reference as if fully set forth herein. The embodiments described herein may include any step(s) of any method(s) described in these patents and may be further configured as described in these patents.

The results of the inspection include information for defects detected in the multiple instances during the inspection, information for hot spots within the at least the portion of the device detected during the inspection, and information for a process window of the process determined by the inspection. The information for the defects may include any suitable information such as image data or images generated for the defects. The information for the defects detected in the multiple instances may also include an indicia of the multiple instance in which each of the defects was detected as well as any other information for the defects that is or can be produced by inspection such as a defect ID, a defect location, a defect size and/or any other characteristics of the defects determined based on output generated during inspection. The information for the hot spots may include information for hot spots detected by a two-pass PWQ inspection, which may be performed as described further herein, as well as any other hot spots that have been detected in any other manner. The information for the hot spots may also include information for a location of each hot spot within the device and/or on the specimen, a hot spot ID, and any other information that can be determined for hot spots. The information for the process window may include any information for a process window determined by a two-pass PWQ inspection, which may be performed as described further herein. In addition, the information for the process window may be expressed in any suitable manner (e.g., as a range of values for one or more parameters of a process that are within the process window).

In one embodiment, the inspection includes a first inspection pass in which the hot spots are detected and a second inspection pass in which the process window is determined. For example, the inspection may be a two-pass PWQ inspection. In particular, the first pass PWQ inspection may be performed to detect hot spots (or hot spots can be provided by a user or another means). In one such example, the locations of any defects found in the first pass PWQ inspection may be identified as locations of hot spots. Even if hot spots are provided from some other means such as simulation or prior knowledge, the first pass PWQ inspection may be performed to find additional hot spots (i.e., it is a discovery scan).

All instances of each hot spot may be found on the die by searching through the design file for the device (e.g., by pattern searching). For example, there may be more than one instance of a given hot spot within a portion of a device being formed on the specimen in a process. In this manner, there may be different types of hot spots within the portion of the device, and there may be one or more instances of each different type of hot spot within the portion of the device. Care areas may be created for the second pass PWQ inspection out of all instances of the hot spots, and each hot spot can be given a unique identifier (e.g., a care area group (CAG) code). "Care areas" can be generally defined in this context as areas on the specimen that have been selected for inspection. In this manner, inspection may be performed in the care areas, but not areas of the specimen that are not within a care area.

The second pass PWQ scan may then be performed, by inspecting only the identified hot spot locations. The second pass PWQ inspection may then be performed only on the hot spots found in the first pass (it is a scan of only those patterns that were identified in the first pass as hot spots), and the purpose is to find the process window more accurately. For example, the values of a parameter corresponding to the multiple instances on the specimen in which no defects were detected in the hot spots by the second pass PWQ inspection may be indicated as values of the parameter that are within the process window. On the other hand, the values of a parameter corresponding to the multiple instances on the specimen in which defects were detected in the hot spots by the second pass PWQ inspection may be indicated as values of the parameter that are outside of the process window.

The second pass PWQ inspection may be performed to find the process window more accurately by having one or more parameters of inspection that are different from those used for the first pass PWQ inspection. For instance, since the second pass PWQ inspection will be performed for only discrete locations on the specimen (e.g., the hot spot locations), the second pass inspection may be performed with parameters that have a lower throughput. In one such example, the second pass PWQ inspection may be performed with a higher resolution than the first pass PWQ inspection. In this manner, the second pass PWQ inspection may detect defects in the hot spots with a higher sensitivity than the first pass PWQ inspection. Since the defect detection may be more sensitive, the process window determined based on the defect detection may be more accurate.

The computer subsystem(s) are also configured for selecting, based on the results of the inspection, a portion of locations within a first of the multiple instances formed on the specimen with a first of the different values that is closest to a value of the parameter at an edge of the process window. Selecting the portion of locations therefore creates a sample of the locations and is therefore also referred to herein as "sampling." The portion of the locations that is selected will, in general, include fewer than all of the locations in the first of the multiple instances. In particular, since there are a number of functions, described further herein, that will be performed for the selected portion of locations and some of those functions (e.g., output (or image) acquisition) may be relatively slow, the selected portion of the locations is preferably as small as possible while still providing sufficient information for the functions described herein. The actual number of locations that are included in the selected portion may be determined as described further herein.

As mentioned above, selecting the portion of the locations may be performed for a first of the multiple instances (and only a first of the multiple instances). For example, the sampling may be started at the highest modulation (i.e., the modulation farthest from nominal) that has not yet determined to be "bad" (where "bad" can be defined as having been determined to be outside of the process window due to defects that were detected in the modulation). Values of the parameter that are not at nominal may be referred to herein (and in the context of PWQ inspection) as "modulated" values. In addition, instances of the device that are formed at a non-nominal value of a parameter of the process may be referred to herein (and in the context of PWQ inspection) as "modulations." In this manner, the selecting is performed for a first of the multiple instances formed at a value of the parameter that is closest to the edge of the process window, which is the highest modulation not yet determined to be bad (or the modulation farthest from nominal that has not been determined to contain defects during the first PWQ scan). This is a fundamental principle behind the sampling approach described herein, the concept of conducting the sampling systematically from a higher modulation to a lower modulation. Once one or more (or all of) the hot spots in one modulation have been processed, the sampling may be moved into a lower modulation (i.e., another instance formed at a value of the parameter that is closer to nominal than the value of the parameter that corresponds to the first of the multiple instances).

In this manner, the sampling may be performed first for marginal modulations. "Marginal modulations" refers to the highest modulation (farthest from nominal) where a hot spot failure was not detected in the first pass inspection. There may be no reason to sample in a modulation farther from nominal than that since it would have been determined from the first pass PWQ inspection that the hot spot is failing there.

In some instances, the selecting (or sampling) described herein can be used as a new sampling approach at the end of the second pass of a PWQ inspection. The embodiments described herein are believed to provide the first sampling schemes designed specifically for determining the process window on PWQ specimens. An advantage of the embodiments described herein over previously used systems and methods for sampling is their superior accuracy in determining the process window.

Since the computer subsystem(s) described herein are included in a system with an output acquisition subsystem, the sampling scheme may be performed by a system configured as a SEM review station (or as the output acquisition is being performed) for the fullest benefit. For example, the proposed sampling may be implemented on a SEM review station (or other system that includes a suitable output acquisition subsystem), where images are taken for ground truth determination. In this manner, the sampling strategy can be adapted to the results of the output acquisition (and functions performed using the acquired output) without wasting sampling budget. As such, the embodiments described herein provide an adaptive sampling methodology for process window determination. There could be a variety of approaches for determining the stopping criteria for sampling, some of which are described further herein.

An advantage of the embodiments described herein is, therefore, the sampling execution on the system that includes the output acquisition subsystem (e.g., the SEM review station) and classification (described further herein) provides substantial benefits in terms of the number of sites that are reviewed to determine a process window, but it also has potential to improve the accuracy with which users can assess the ground truth (if the "classification" of SEM images is performed manually). In contrast, a static sampling strategy can be implemented on the inspection tool (e.g., an optical inspection tool). Such a sampling scheme can leverage most of the concepts described herein, but would definitely be inferior as it would not be able to eliminate the unnecessary sampling from modulations where the hot spots no longer fail.

In addition, although the embodiments described herein are described primarily with respect to PWQ wafers, a similar methodology can be used for focus exposure modulation (FEM) wafers as well. Furthermore, although the embodiments are described herein with respect to "a parameter" of the process, the modulations may vary in more than one parameter of the process (e.g., dose and focus). The manner in which selecting is performed across different values of the two or more parameters (e.g., across 2 or more dimensions) of modulation can vary.

In one embodiment, selecting the portion of the locations is performed independently for different groups of the hot spots. For example, the sampling described herein can be performed independently for each different group of hot spots (or each different type of hot spot). Sampling from highest to lowest modulation (i.e., from a modulation farther from nominal to a modulation closer to nominal) and for each type of hot spot independently makes the sampling particularly efficient because 1) it becomes possible to stop sampling a hot spot closer to nominal once that hot spot stops failing at a modulation farther from nominal and 2) it makes it possible to focus most of the sample size on the marginal modulation where the hot spot has the lowest failure rate (where failure rate can be defined generally as the number of failing sites divided by the number of those structures in the dies). Therefore, one advantage of the embodiments described herein is that they can concentrate the sample into the marginal modulation(s) that define the process window. Modulations farther from nominal than the marginal modulations can be sampled less because the failures should be more frequent and/or have larger optical signal. Modulations closer to nominal than the marginal modulations may not be sampled at all once a modulation farther from nominal has been determined to be "good" (i.e., within the process window).

In another embodiment, the selected portion of the locations includes locations at which the inspection detected the defects. For example, a hot spot may be selected for whichever modulation that sampling is currently being performed. Several instances of the hot spot at which inspection detected a defect may be selected. Selecting the instances of the hot spot may be performed by sampling the highest energy defects and/or through a diversification scheme. For example, the exact manner in which defects are sampled in each modulation for each hot spot may be modified, and the embodiments described herein are not limited in any manner of selecting the locations at which the inspection detected the defects. However, the most likely options will be to sample the highest signal (e.g., energy/magnitude/spot likeness) defects or to include some diversity in the sample (i.e., selecting defects having the most diversity in a characteristic of the defects).

In an additional embodiment, the selected portion of the locations includes locations at which the inspection did not detect the defects. For example, the selecting may be performed based on information about the results of the inspection performed on the specimen (e.g., information for hot spots or locations in the portion of the device at which a defect signal was and was not detected) with information for a design for the specimen (e.g., which can be used to identify locations of hot spots at which a defect signal was not detected) to allow sampling the hot spot locations without any detected defect signal for higher accuracy. In other words, defects may not be detected at all instances of one type of hot spot in a modulation. The information included in the results of the inspection can be used in combination with information for the design of the device to identify instances of the one type of hot spot in which no defect was detected. Then, selecting the portion of the locations may be performed based on which instances of the hot spot in which defects were detected and which instances of the hot spot in which defects were not detected. In this manner, the selected portion of the locations may be selected to include only hot spots in which defects were detected, only hot spots in which defects were not detected, or some combination thereof. In one such example, when no defect has been detected for a selected hot spot in a selected modulation or when the detected defects are nuisances (which may be determined by the computer subsystem(s) as described further herein), the computer subsystem(s) may sample randomly the corresponding care area sites. In addition, the second pass care areas for PWQ inspection may be made available to the computer subsystem(s) so that they can be sampled if no defects are detected by the inspection system.

In this manner, the selected portion of the locations may include only locations at which defects were detected, only locations at which defects were not detected, or some locations at which defects were detected as well as other locations at which no defects were detected. For instance, as described further herein, if, for some particular purpose, a predetermined number of locations are to be selected such that other functions described herein can be performed (e.g., failure rate determination), and if the number of defects detected at the locations is less than the predetermined number, locations at which defects were detected may be selected first and then locations at which defects were not detected can be selected in some manner (e.g., randomly) to provide the remaining number of locations.

In some embodiments, the computer subsystem(s) are configured to determine a number of the locations that are selected based on a predetermined confidence for determining a failure rate of the locations, and the computer subsystem(s) are configured to determine the failure rate based on the defects determined to be present at the locations in the selected portion. For example, the search for sub-signal locations (e.g., locations at which a defect was not detected) can be performed in a manner that links confidence of the method to the failure rate (i.e., the sample size in a marginal modulation (or any modulation) can be set by requirements of identifying a certain failure rate or higher with a given confidence). In other words, the hot spot failure rate that is desired to be identified at the process window edge can be used to determine the sample size for a given confidence of the method. In particular, if the computer subsystem(s) are to determine, with a certain confidence, whether a structure fails at a rate of "f" or higher, and defects have not been detected in that structure by inspection, the computer subsystem(s) can sample the sites randomly instead of sampling based on the inspection results. In other words, the inspection results can be used for defects that have been detected, but when sampling a modulation where no defects have been detected by inspection, random sampling may be performed using the known design coordinates of the structure locations. As such, a process window may be correctly determined down to failure rate "f" irrespective of whether the inspection has detected defects at the locations or not.

The embodiments described herein may also be used to estimate the failure rate of each hot spot in every modulation. For this capability to exist, random sampling and output acquisition for the randomly selected sample of the hot spots may be performed even if a failure was found quickly through a detected defect. In other words, although, in some instances, sampling of and output acquisition for a hot spot may be stopped once a defect has been found in one of the selected locations of the hot spot, when determining a failure rate of a hot spot, the functions described herein may be performed for all of the locations in the selected portion regardless of the results produced by the embodiments described herein for each individual location in the selected portion. In this manner, the embodiments described herein may be configured for specifying and reporting the upper bound on error with which the process window has been determined as described further herein.

In a further embodiment, selecting the portion of the locations includes selecting as many of the locations at which the defects were detected by the inspection as possible for inclusion in the selected portion of the locations. For example, the sampling described herein makes it possible to shift the focus from defect sampling to hot spot location random sampling depending on the size of the process window. In one such example, for a large process window and a relatively small modulation step, the failure rate at the edge of the process window is likely to be relatively low. In this manner, concentrating the sampling on the locations at which a defect was detected by inspection is likely to produce better results. However, if there are not enough defect locations detected by inspection to generate a sufficient sample of the locations for a particular hot spot in a particular modulation, random sampling may be performed to generate the desired sample size.

In another embodiment, selecting the portion of the locations includes randomly selecting locations of the hot spots for inclusion in the selected portion of the locations. For example, as described above, the sampling described herein makes it possible to shift the focus from defect sampling to hot spot location random sampling depending on the size of the process window. In one such example, a relatively small process window and a relatively large modulation step results typically in relatively abrupt transitions from good to bad with significant failure rates, which favors randomly sampling of hot spot locations. In addition, one advantage of the embodiments described herein is that they can be used to find failures in modulations where no defect has been detected. Such failure discovery can be performed by intelligent random sampling of hot spot sites, e.g., with the sample size determined by the requirements on sensitivity to a certain failure rate. Some other currently used sampling approaches may focus on sub-threshold inspection signals, but those inspection signals are deliberately ignored in the embodiments described herein.

In some embodiments, the hot spots include different groups of hot spots. In one such embodiment, the portion of the locations is selected to include the hot spots in only one of the different groups. In another such embodiment, the portion of the locations is selected to include the hot spots in more than one of the different groups. For example, the sequence in which the hot spots and modulations are processed can vary (e.g., process all modulations for one type of hot spot and then move to the next type of hot spot, or process one modulation for all types of hot spots and then move to the next modulation).

The computer subsystem(s) are also configured for acquiring the output of the output acquisition subsystem for at least one of the locations in the portion. Acquiring the output of the output acquisition subsystem for one or more of the locations in the portion may be performed as described further herein. The output that is acquired may include any of the output described herein. The order in which the hot spots and modulations are sampled can be optimized for fastest output acquisition (e.g., SEM imaging).

The computer subsystem(s) are further configured for determining if defects are present at the at least one of the locations based on the acquired output. Determining if the defects are present at the location(s) at which the output has been acquired may be performed in any suitable manner. For example, the computer subsystem(s) may be configured to detect or re-detect defects at the location(s) at which the output has been acquired by applying a defect detection method and/or algorithm to the acquired output. The defect detection method and/or algorithm may include any suitable method and/or algorithm known in the art. In addition, all the hot spots used in a second pass PWQ inspection may come from the first pass PWQ inspection, which means that the hot spots were detected and SEM reviewed after the first pass inspection. The SEM ADC (automatic defect classifier) or defect detection on the SEM performed by the computer subsystems can then be trained to give reliable feedback on whether a defect detected by inspection is nuisance or real. In other words, the first pass PWQ inspection results can be used to create or modify the classifier, and then the classifier can be used in the second pass PWQ inspection to guide the sampling.

When one or more of the defects are determined to be present at the at least one of the locations, the computer subsystem(s) are configured for repeating the selecting, acquiring the output, and determining if the defects are present for another of the multiple instances formed on the specimen with another of the different values that is closer to nominal than the first of the different values. For example, once a selected hot spot and a selected modulation are determined to be "bad," a new hot spot (which may or may not be of the same type as the previous hot spot) and a modulation that is closer to nominal than the previously used modulation may be selected. Sampling may then be performed as described further herein for the new hot spot and modulation. In addition, the output may be acquired for one or more of the newly sampled locations and the output may be used to determine if defects are present in the newly sampled location(s), which may be performed as described further herein. These steps may be repeated as many times as necessary or desired (e.g., until no defects are found in the sampled locations).

In some embodiments, when the selecting is repeated, selecting the portion of the locations within the other of the multiple instances is performed based on the results of the inspection and the one or more defects determined to be present at the at least one of the locations in the first of the multiple instances. For example, the information generated by the computer subsystem(s) when determining if a defect is present in a selected location may be combined with the inspection results generated in some other manner (e.g., by two pass PWQ inspection) to guide the sampling described herein. In one such example, when the computer subsystem(s) detect a significant number of defects in a selected portion of locations that were not detected by the original inspection, that difference in detected defectivity may indicate a lack of sensitivity of the original inspection to the newly detected defects. In this manner, additional sampling that is performed for other instances formed at other modulated values may be more heavily focused on the same type of locations where the significant new defectivity was identified in the first modulated value. As such, if defects were missed by the original inspection in the same type of locations in other modulations, the increased sampling of the same type of locations in additional modulation(s) will help identify other instances of defects that were not detected in those locations by the original inspection.

In another embodiment, the computer subsystem(s) are configured for classifying the defects determined to be present at one or more of the locations in the selected portion based on the acquired output and modifying the selected portion of the locations based on results of the classifying. Classifying the defects determined to be present may be performed using any suitable defect classification method and/or algorithm known in the art. For example, there could be a variety of ways to guide the sampling strategy, from manual classification to fully automated defect classification on SEM. In other words, the classification results produced for one sample of locations can be fed back to the sampling regardless of how classification is performed. In addition, the confidence of the process window determination described further herein can be improved with minimum tool time requirements, especially if determining if the defects are present (e.g., SEM review) is followed with automatic defect classification.

In some embodiments, acquiring the output and determining if the defects are present are performed for a first of the locations in the portion, and when the one or more defects are determined to be present in the first of the locations, the computer subsystem(s) are configured for determining that acquiring the output and determining if the defects are present are not to be performed for any other of the locations in the selected portion. For example, the details of when to stop sampling a particular modulation (and/or when to stop acquiring the output for locations in a selected portion) will depend on whether the user is interested in identifying the overall process window or a process window per hot spot, e.g., if the interest is in overall process window, there is no need to keep sampling a modulation once a hot spot is identified as failing in that modulation. In this manner, if the interest is knowing the process window without caring for which hot spot fails where, it is possible to move to the next modulation (closer to nominal) immediately after any failure has been identified.

In one embodiment, when the defects are determined to be not present at the locations in the selected portion, the computer subsystem(s) are configured for determining that the selecting, acquiring the output, and determining if the defects are present are not to be performed for any other of the multiple instances. For example, as described further above, sampling from highest to lowest modulation and for each type of hot spot independently makes the selecting particularly efficient because it makes it possible to stop sampling a hot spot closer to nominal once that hot spot stops failing at a modulation farther from nominal and it makes it possible to focus most of the sample size on the marginal modulation where the hot spot has the lowest failure rate. In this manner, once it has been determined that no defects can be found in a given hot spot in a given modulation, the hot spot may be indicated as no longer failing and that there is no need to sample it in a lower modulation.

When the defects are determined to be not present at the locations in the selected portion, the computer subsystem(s) are configured for determining a revised process window based on which of the different values corresponds to the multiple instance in which the defects were determined to be not present. For example, once the computer subsystem(s) have determined that none of the hot spots in a given modulation are defective, that modulated value of the parameter may be designated as one outer edge of the process window. More specifically, since the sampling, output acquisition, and defect determination is performed from the modulated value of the parameter at the previously determined outer edge and may be repeated for one or more modulated values closer to nominal than the modulation at the outer edge until a modulation is identified as "defect free," which may be defined as substantially free of (or completely free of) defects that have a known impact on yield of the device, the modulated parameter value of that defect free modulation can be confidently determined to be one outer edge of the process window. In this manner, the computer subsystem(s) described herein may modify the originally determined process window that may have been determined by PWQ inspection.

Furthermore, as described herein, the steps performed by the computer subsystem(s) may be first performed for one value of a parameter of the process at a previously determined edge of the process window, and the steps may be repeated for additional modulations that are progressively closer to nominal until a "good" modulation is found that is identified as the new process window edge. However, any process window will typically have two edges for any one parameter that define the upper and lower limits on a process parameter (and when a process is operating at a value between those upper and lower limits, the process can be expected to be producing satisfactory results). Therefore, the computer subsystem(s) described herein may perform the steps described herein beginning at one marginal modulation at one edge of the previously determined process window until a "good" modulation is found, and then the computer subsystem(s) may perform the step(s) described herein beginning at a different marginal modulation at the other edge of the previously determined process window until an additional "good" modulation is found. In this manner, the computer subsystem(s) can perform the steps described herein to modify the parameter values at both previously determined edges of a process window. As such, the computer subsystem(s) described herein can be used to advantageously improve the accuracy with which any process window edge is determined (e.g., all or some of the process window edges).

Furthermore, typically each side of a process window is determined by different types of failure, which may affect the sampling strategy. For example, imagine that a particular metal in a hot spot that is being monitored becomes narrower as the exposure (+ direction) is increased and becomes thicker when exposure is decreased (− direction). In this case, "line open" defects would only happen in the "+" direction, whereas on the "−" side there may be "bridges" between lines, and never the other way around. So, from the point of view of sampling, when monitoring "line opens" sampling may be performed from the "+" direction down, but once the failure is no longer detected, sampling may not be continued on the "−" side, and vice versa for bridges.

Another embodiment relates to a computer-implemented method for determining a process window for a process performed on a specimen. The method includes steps for each of the functions of the computer subsystem(s) described above.

Each of the steps of the method may be performed as described further herein. The method may also include any other step(s) that can be performed by the output acquisition subsystem and/or computer subsystem(s) or system(s) described herein. The steps of the method are performed by one or more computer subsystems, which may be configured according to any of the embodiments described herein. In addition, the method described above may be performed by any of the system embodiments described herein.

Figure 4:
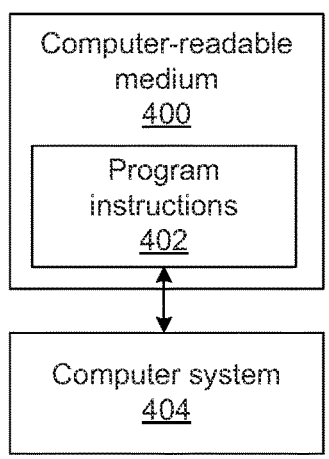
FIG. 4 is a block diagram illustrating one embodiment of a non-transitory computer-readable medium storing program instructions executed on a computer system for performing one or more of the computer-implemented methods described herein.

An additional embodiment relates to a non-transitory computer-readable medium storing program instructions executed on a computer system for performing a computer-implemented method for determining a process window for a process performed on a specimen. One such embodiment is shown in FIG. 4. In particular, as shown in FIG. 4, non-transitory computer-readable medium 400 includes program instructions 402 executable on computer system 404. The computer-implemented method may include any step(s) of any method(s) described herein.

Program instructions 402 implementing methods such as those described herein may be stored on computer-readable medium 400. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system 404 may be configured according to any of the embodiments described herein.

All of the methods described herein may include storing results of one or more steps of the method embodiments in a computer-readable storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc.

Further modifications and alternative embodiments of various aspects of the invention will be apparent to those skilled in the art in view of this description. For example, methods and systems for determining a process window for a process performed on a specimen are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to determine a process window for a process performed on a specimen, comprising:

an output acquisition subsystem comprising at least an energy source and a detector, wherein the energy source is configured to generate energy that is directed to the specimen, and wherein the detector is configured to detect energy from the specimen and to generate output responsive to the detected energy; and one or more computer subsystems configured for:

acquiring results of an inspection of the specimen, wherein the specimen comprises multiple instances of a device formed thereon with different values of a parameter of the process performed on the specimen, and wherein the results of the inspection comprise information for defects detected in the multiple instances during the inspection, information for hot spots within the device detected during the inspection, and information for the process window of the process determined by the inspection;

selecting, based on the results of the inspection, a portion of locations within a first of the multiple instances formed on the specimen with a first of the different values that is closest to a value of the parameter at an edge of the process window, wherein the portion of locations comprises fewer than all of the locations within the first of the multiple instances;

acquiring the output of the output acquisition subsystem for at least one of the locations in the portion;

determining if defects are present at the at least one of the locations based on the acquired output;

when one or more of the defects are determined to be present at the at least one of the locations, repeating the selecting, acquiring the output, and determining if the defects are present for another of the multiple instances formed on the specimen with another of the different values that is closer to nominal than the first of the different values; and when the defects are determined to be not present at the locations in the selected portion, determining a revised process window based on which of the different values corresponds to the multiple instance in which the defects were determined to be not present.

2. The system of claim 1, wherein the inspection comprises a first inspection pass in which the hot spots are detected and a second inspection pass in which the process window is determined.

3. The system of claim 1, wherein selecting the portion of the locations is performed independently for different groups of the hot spots.

4. The system of claim 1, wherein, when the selecting is repeated, selecting the portion of the locations within the other of the multiple instances is performed based on the results of the inspection and the one or more defects determined to be present at the at least one of the locations in the first of the multiple instances.

5. The system of claim 1, wherein the selected portion of the locations comprises locations at which the inspection detected the defects.

6. The system of claim 1, wherein the selected portion of the locations comprises locations at which the inspection did not detect the defects.

7. The system of claim 1, wherein the one or more computer subsystems are further configured to determine a number of the locations that are selected based on a predetermined confidence for determining a failure rate of the locations, and wherein the one or more computer subsystems are further configured to determine the failure rate based on the defects determined to be present at the locations in the selected portion.

8. The system of claim 1, wherein selecting the portion of the locations comprises selecting as many of the locations at which the defects were detected by the inspection as possible for inclusion in the selected portion of the locations.

9. The system of claim 1, wherein selecting the portion of the locations comprises randomly selecting locations of the hot spots for inclusion in the selected portion of the locations.

10. The system of claim 1, wherein acquiring the output and determining if the defects are present are performed for a first of the locations in the portion, and wherein when the one or more defects are determined to be present in the first of the locations, the one or more computer subsystems are further configured for determining that acquiring the output and determining if the defects are present are not to be performed for any other of the locations in the selected portion.

11. The system of claim 1, wherein when the defects are determined to be not present at the locations in the selected portion, the one or more computer subsystems are further configured for determining that the selecting, acquiring the output, and determining if the defects are present are not to be performed for any other of the multiple instances.

12. The system of claim 1, wherein the one or more computer subsystems are further configured for classifying the defects determined to be present at one or more of the locations in the selected portion based on the acquired output and modifying the selected portion of the locations based on results of the classifying.

13. The system of claim 1, wherein the hot spots comprise different groups of hot spots, and wherein the portion of the locations is selected to include the hot spots in only one of the different groups.

14. The system of claim 1, wherein the hot spots comprise different groups of hot spots, and wherein the portion of the locations is selected to include the hot spots in more than one of the different groups.

15. The system of claim 1, wherein the specimen comprises a wafer.

16. The system of claim 1, wherein the energy directed to the specimen comprises light, and wherein the energy detected from the specimen comprises light.

17. The system of claim 1, wherein the energy directed to the specimen comprises electrons, and wherein the energy detected from the specimen comprises electrons.

18. A non-transitory computer-readable medium, storing program instructions executed on a computer system for performing a computer-implemented method for determining a process window for a process performed on a specimen, wherein the comp implemented method comprises:

acquiring results of an inspection of the specimen, wherein the specimen comprises multiple instances of a device formed thereon with different values of a parameter of the process performed on the specimen, and wherein the results of the inspection comprise information for defects detected in the multiple instances during the inspection, information for hot spots within the device detected during the inspection, and information for the process window of the process determined by the inspection;

selecting, based on the results of the inspection, a portion of locations within a first of the multiple instances formed on the specimen with a first of the different values that is closest to a value of the parameter at an edge of the process window, wherein the portion of locations comprises fewer than all of the locations within the first of the multiple instances;

acquiring output of an output acquisition subsystem for at least one of the locations in the portion, wherein the output acquisition subsystem comprises at least an energy source and a detector, wherein the energy source is configured to generate energy that is directed to the specimen, and wherein the detector is configured to detect energy from the specimen and to generate output responsive to the detected energy;

determining if defects are present at the at least one of the locations based on the acquired output;

when one or more of the defects are determined to be present at, the at least one of the locations, repeating the selecting, acquiring the output, and determining if the defects are present for another of the multiple instances formed on the specimen with another of the different values that is closer to nominal than the first of the different values; and when the defects are determined to be not present at the locations in the selected portion, determining a revised process window based on which of the different values corresponds to the multiple instance in which the defects were determined to be not present, wherein acquiring the results, selecting the portion, acquiring the output, determining if the defects are present, and determining the revised process window are performed with one or more computer subsystems.

19. A computer-implemented method for determining a process window for a process performed on a specimen, comprising:

acquiring results of an inspection of the specimen, wherein the specimen comprises multiple instances of a device formed thereon with different values of a parameter of the process performed on the specimen, and wherein the results of the inspection comprise information for defects detected in the multiple instances during the inspection, information for hot spots within the device detected during the inspection, and information for the process window of the process determined by the inspection;

selecting, based on the results of the inspection, a portion of locations within a first of the multiple instances formed on the specimen with a first of the different values that is closest to a value of the parameter at an edge of the process window, wherein the portion of locations comprises fewer than all of the locations within the first of the multiple instances;

acquiring output of an output acquisition subsystem for at least one of the locations in the portion, wherein the output acquisition subsystem comprises at least an energy source and a detector, wherein the energy source is configured to generate energy that is directed to the specimen, and wherein the detector is configured to detect energy from the specimen and to generate output responsive to the detected energy;

determining if defects are present at the at least one of the locations based on the acquired output;

when one or more of the defects are determined to be present at the at least one of the locations, repeating the selecting, acquiring the output, and determining if the defects are present for another of the multiple instances formed on the specimen with another of the different values that is closer to nominal than the first of the different values; and when the defects are determined to be not present at the locations in the selected portion, determining a revised process window based on which of the different values corresponds to the multiple instance in which the defects were determined to be not present, wherein acquiring the results, selecting the portion, acquiring the output, determining if the defects are present, and determining the revised process window are performed with one or more computer subsystems.

* * * * *